(12) United States Patent
Takahashi

(10) Patent No.: US 7,947,343 B2
(45) Date of Patent: May 24, 2011

(54) ADHESIVE FILM

(75) Inventor: Toyosei Takahashi, Tokyo (JP)

(73) Assignee: Sumitomo Bakelite Company, Ltd, Tokyo (JP)

( * ) Notice: Subject to any disclaimer, the term of this patent is extended or adjusted under 35 U.S.C. 154(b) by 81 days.

(21) Appl. No.: 12/224,097

(22) PCT Filed: Feb. 27, 2006

(86) PCT No.: PCT/JP2006/303600
§ 371 (c)(1),
(2), (4) Date: Aug. 18, 2008

(87) PCT Pub. No.: WO2007/097022
PCT Pub. Date: Aug. 30, 2007

(65) Prior Publication Data
US 2009/0202752 A1    Aug. 13, 2009

(51) Int. Cl.
*C09D 163/02* (2006.01)
*C09D 4/02* (2006.01)

(52) U.S. Cl. .................. 428/1.53; 428/1.5; 525/404

(58) Field of Classification Search .............. 428/1.53, 428/1.5; 525/404
See application file for complete search history.

(56) References Cited

U.S. PATENT DOCUMENTS

| | | | |
|---|---|---|---|
| 7,371,335 B2 * | 5/2008 | Cho et al. ................ | 252/181.6 |
| 2002/0076558 A1 | 6/2002 | Tomiyoshi et al. | |
| 2002/0111454 A1 * | 8/2002 | Cho et al. ................ | 528/129 |
| 2004/0067440 A1 * | 4/2004 | Minegishi et al. ........ | 430/280.1 |
| 2006/0043544 A1 | 3/2006 | Tsukamoto et al. | |
| 2006/0223903 A1 * | 10/2006 | Cao et al. ................ | 522/81 |

FOREIGN PATENT DOCUMENTS

| | | |
|---|---|---|
| EP | 1 633 002 | 3/2006 |
| JP | 03-6278 | 1/1991 |
| JP | 10-313070 | 11/1998 |
| JP | 11-145337 | 5/1999 |
| JP | 2000-191745 | 7/2000 |
| JP | 2002-338932 | 11/2002 |
| JP | 2005-89710 | 4/2005 |
| JP | 2006-16610 | 1/2006 |
| JP | 2006-70053 | 3/2006 |
| JP | 2006-70054 | 3/2006 |
| KR | 2006-0050859 | 5/2006 |

OTHER PUBLICATIONS

Handbook of Fillers, George Wypych, 2nd Ed., 2000, p. 170.*
Supplementary European Search Report for Application No. EP 06 71 4737 dated Apr. 28, 2010.
Roland et al., "Zeolites", Ullmann's Encyclopedia of Industrial Chemistry, Jun. 15, 2000, pp. 1-31.
Database WPI Week 200532, Thomson Scientific, London, GB, AN 2005-309587, XP002576791, pp. 1-2, Apr. 7, 2005.
Database WPI Week 200482, Thomson Scientific, London, GB, AN 2004-826084, XP002576792, pp. 1-2, Nov. 18, 2004.

* cited by examiner

*Primary Examiner* — Satya B Sastri
(74) *Attorney, Agent, or Firm* — Smith, Gambrell & Russell, LLP

(57) ABSTRACT

An adhesive film used for bonding a semiconductor component or a liquid crystal display component with a substrate, the adhesive film being composed of a resin composition containing a curable resin and a filler, and the adhesive film showing a water vapor transmission rate of 30 [$g/m^2 \cdot 24\ h$] or above, wherein the curable resin preferably contains photo-curable resin, thermosetting resin, or curable resin cured both by light and heat. The filler preferably contains a porous filler, the filler preferably has a mean void diameter of 0.1 to 5 nm, and the adhesive film preferably shows a water vapor transmission rate at 25° C. of 4 [$g/m^2 \cdot 24\ h$] or above.

11 Claims, No Drawings

ADHESIVE FILM

TECHNICAL FIELD

The present invention relates to an adhesive film.

BACKGROUND ART

In the process of bonding a semiconductor component such as semiconductor element or a liquid crystal display component, with a substrate such as rigid substrate represented by interposer, or an insulating substrate composed of organic or inorganic material, a liquid resin, for example, which serves as an adhesive is typically used as being selectively coated on either one of the semiconductor element and the substrate by using a dispenser or by potting, or as being partially coated typically using a squeegee (see Patent Document 1, for example).

Depending on types of the semiconductor component or liquid crystal display component, in the process of bonding the component and the substrate, the adhesive is selectively coated only to the peripheral portion, and the component and the substrate are bonded so as to obtain a structure having a space formed therein (so-called hollow package), rather than bonding them by coating the adhesive over the entire surface. In particular, if a general adhesive is applied to such structure using a transparent component such as glass as the substrate, the transparent component may get dewed in the inner space. In particular for the case where the semiconductor component is a solid-state image sensor, the dewing may prevent the solid-state image sensor from exactly taking part in photoelectric conversion, and may raise problems in image recognition and display.

[Patent Document 1] Japanese Laid-Open Patent Publication No. H10-313070.

DISCLOSURE OF THE INVENTION

An object of the present invention is to provide a highly reliable adhesive film capable of preventing dewing possibly occurs between the semiconductor component or liquid crystal display component, and the substrate.

The object may be achieved by the present invention described in (1) to (16) below.

(1) An adhesive film used for bonding a semiconductor component or a liquid crystal display component with a substrate, wherein the adhesive film is composed of a resin composition containing a curable resin and a filler, and the adhesive film shows a water vapor transmission rate, measured conforming to JIS Z0208 Method-B, of 30 $[g/m^2 \cdot 24\ h]$ or above.

(2) The adhesive film as described in (1), wherein the curable resin contains a photo-curable resin.

(3) The adhesive film as described in (2), wherein the photo-curable resin contains a ultraviolet curable resin having an acrylic compound as a major constituent.

(4) The adhesive film as described in (1), wherein the curable resin contains a thermosetting resin.

(5) The adhesive film as described in (4), wherein the thermosetting resin contains an epoxy resin.

(6) The adhesive film as described in (1), wherein the curable resin contains a curable resin curable both by light and heat.

(7) The adhesive film as described in (6), wherein the curable resin curable both by light and heat contains a (meth)acryl-modified phenol resin or (meth)acryloyl-group-containing (meth)acrylic acid polymer.

(8) The adhesive film as described in (1), wherein the filler contains a porous filler.

(9) The adhesive film as described in (8), wherein the filler has a mean void diameter of 0.1 to 5 nm.

(10) The adhesive film as described in (8), wherein the filler shows an adsorptivity [Q1] under room temperature (increase in weight of the filler completely dried under heating and weighed in an aluminum cup, after allowed to stand in a 25° C./50% environment for 168 hours) of 7 [g/100 g filler] or above.

(11) The adhesive film as described in (10), wherein the filler shows an adsorptivity [Q2] at 60° C. (increase in weight of the filler completely dried under heating and weighed in an aluminum cup, after allowed to stand in a 60° C./90% environment for 168 hours) of 3 [g/100 g filler] or above.

(12) The adhesive film as described in (11), satisfying $0.4 \times [Q1] < [Q2]$

(13) The adhesive film as described in (8), wherein the filler is zeolite.

(14) The adhesive film as described in (1), wherein the adhesive film shows a water vapor transmission rate, measured conforming to JIS Z0208 Method-B, of 200 $[g/m^2 \cdot 24\ h]$ or below.

(15) The adhesive film as described in (1), wherein the adhesive film shows a water vapor transmission rate at 25° C. (measured conforming to JIS Z0208, under conditions of moisture permeation treatment of 25° C./50%) of 4 $[g/m^2 \cdot 24\ h]$ or above.

(16) The adhesive film as described in (1), wherein the substrate shows a water vapor transmission rate, measured conforming to JIS Z0208 Method-B, of less than 30 $[g/m^2 \cdot 24\ h]$.

According to the present invention, there is provided a highly reliable adhesive film capable of preventing dewing possibly occurs between a semiconductor component or a liquid crystal display component, and a substrate. The adhesive film scarcely causes corrosion of internal electrodes, and may keep the reliability for long period.

BEST MODES FOR CARRYING OUT THE INVENTION

The adhesive film of the present invention will be detailed below. The adhesive film of the present invention is the one used for bonding a semiconductor component or a liquid crystal display component with a substrate, wherein the adhesive film is composed of a resin composition containing a curable resin and a filler, and shows a water vapor transmission rate of 30 $[g/m^2 \cdot 24\ h]$ or above.

The adhesive film of the present invention is used for bonding a semiconductor component or a liquid crystal display component with a substrate. In the bonding of a semiconductor component or a liquid crystal display component with a substrate, it is necessary that an adhesive component is formed precisely to a predetermined portion of the semiconductor component or the like (or substrate). The adhesive film of the present invention is suitable for the requirement.

The adhesive film is composed of a resin composition containing a curable resin and a filler, wherein the adhesive film shows a water vapor transmission rate of 30 $[g/m^2 \cdot 24\ h]$ or above. By virtue of this configuration, even when the film is used for adhesion of a semiconductor component or a liquid crystal display component with a substrate, the substrate (in particular, transparent substrate) or the like may be prevented from getting dewed due to internal moisture.

In order to prevent the substrate or the like from getting dewed due to moisture, there has been known to control water vapor transmission rate of the adhesive and so forth. A method of lowering the water vapor transmission rate of the adhesive and so forth (to as low as 10 $[g/m^2 \cdot 24\ h]$ or below, for example) in order to prevent the dewing has been examined, only to find difficulty.

In contrast, the present invention prevents occurrence of the dewing, not by lowering the water vapor transmission rate of the adhesive film as being conventionally practiced, but conversely by raising it so as to make the film improved in the gas permeability.

Water vapor transmission rate of the adhesive film is preferably [g/m$^2$·24 h] or above, and more preferably 50 to 200 [g/m$^2$·24 h]. The water vapor transmission rate lower than the lower limit value may result in insufficient prevention of dewing of the substrate and so forth. The water vapor transmission rate exceeding the upper limit may degrade film-forming performance.

The water vapor transmission rate of the adhesive film may be evaluated by using a 100-μm-thick adhesive film, conforming to the moisture permeable cup method (JIS Z0208 Method-B), at 40° C./90%.

Water vapor transmission rate of the adhesive film at 25° C. is preferably adjusted to 4 [g/m$^2$·24 h] or above. In this way, in particular the substrate or the like may effectively be prevented from getting dewed. The water vapor transmission rate of the adhesive film at 25° C. may be evaluated using an adhesive film of 100 μm thick, conforming to the water vapor permeability cup method (JIS Z0208), under conditions for water vapor permeation treatment of 25° C./50%.

Reason why the adhesive film of the present invention can prevent dewing may be supposed as follows.

For example, dewing occurred between the semiconductor component and the substrate (inner space) may be supposedly ascribable to moisture confined into the inner space in the process of bonding, and moisture coming into the inner space through the adhesive layer after the bonding. A method of lowering water vapor transmission rate of the adhesive film could not completely reduce the water vapor transmission rate to zero, instead allowing moisture to slowly enter the inner space over a long period of time, while being incapable of releasing it to the external, making it difficult to solve the problem of dewing. In contrast, the adhesive film of the present invention has a relatively large water vapor transmission rate, capable of immediately releasing moisture occurred in the inner space to the extend, and thereby the dewing may effectively be prevented.

The curable resin composing the resin composition may be exemplified by photo-curable resin (resin curable mainly by irradiation of light such as ultraviolet radiation), and thermosetting resin (resin curable mainly by heat).

The curable resin preferably contains the photo-curable resin, although not specifically limited. In this way, accuracy of alignment of the adhesive component may be improved. This is because inclusion of the photo-curable resin may facilitate placement of the adhesive film to a predetermined position, through light exposure, development, and patterning.

The photo-curable resin (in particular, ultraviolet curable resin) may be exemplified by ultraviolet curable resins having acrylic compound as a major constituent; ultraviolet curable resin having urethane acrylate oligomer or polyester urethane acrylate oligomer as a major constituent; and ultraviolet curable resin having at least either one selected from the group consisting of epoxy-base resin and vinyl-phenol-base resin.

Among these, the ultraviolet curable resin having acrylic compound as a major constituent is preferable. The acrylic compound shows rapid rate of curing when irradiated with light, so as to allow the resin to be patterned only with a relatively small energy of light exposure. The acrylic compound may be exemplified by monomers of acrylic acid esters or methacrylic acid esters, and more specifically by bifunctional acrylates such as ethylene glycol diacrylate, ethylene glycol dimethacrylate, 1,6-hexanediol diacrylate, 1,6-hexanediol dimethacrylate, glycerin diacrylate, glycerin dimethacrylate, 1,10-decanediol diacrylate, 1,10-decanediol dimethacrylate; and multifunctional acrylates such as trimethylolpropane triacrylate, trimethylolpropane trimethacrylate, pentaerythritol triacrylate, pentaerythritol trimethacrylate, dipentaerythritol hexaacrylate, and dipentaerythritol hexamethacrylate. Among these, acrylic acid esters are preferable, and acrylic acid esters or methacrylic alkyl esters having 1 to 15 carbon atoms in the ester portions thereof are particularly preferable.

Content of the photo-curable resin (ultraviolet curable resin) is preferably 5 to 60 wt % of the whole resin composition, and more preferably 8 to 30 wt %, although not specifically limited. The content below the lower limit value may inhibit patterning of the resin by ultraviolet irradiation, whereas the content exceeding the upper limit value may make the resin too soft, and may degrade film characteristics before ultraviolet irradiation.

The photo-curable resin (in particular, ultraviolet curable resin) preferably exist in a liquid format normal temperature, although not specifically limited. As a consequence, reactivity in ultraviolet-induced curing may be improved. In addition, operation of mixing it with the thermosetting resin may be facilitated. The ultraviolet curable resin exists in a liquid form at room temperature may be exemplified by ultraviolet curable resin having the above-described acryl compounds as the major constituent.

The resin composition may more preferably be used as being combined with a photo-polymerization initiator. In this way, the resin may efficiently be patterned based on photo-polymerization.

The photo-polymerization initiator may be exemplified by benzophenon, acetophenone, benzoin, benzoin isobutyl ether, methyl benzoyl benzoic acid, benzoyl benzoic acid, benzoin methyl ether, benzylphenyl sulfide, benzyl, dibenzyl, and diacetyl.

Content of the photo-polymerization initiator is preferably 0.5 to 5 wt % of the whole resin composition, and more preferably 0.8 to 2.5 wt %, although not specifically limited. The content smaller than the lower limit value may degrade the effect of initiating the photo-polymerization, whereas the content exceeding the upper limit value may make the reactivity too large, and may thereby degrade the storability and resolution performance.

It is preferable that the curable resin additionally contains a thermosetting resin. In this way, the adhesive film may retain adhesiveness even after light exposure, development and patterning. More specifically, the semiconductor component or the like may be bonded to the substrate, by disposing the adhesive component at a predetermined position by placing the adhesive film and by subjecting it to light exposure, development and patterning, followed by thermocompression bonding.

The thermosetting resin may be exemplified by novolac-type phenol resins such as phenol novolac resin, cresol novolac resin and bisphenol-A novolac resin; phenol resins such as resol phenol resin; bisphenol-type epoxy resins such as bisphenol-A epoxy resin and bisphenol-F epoxy resin; novolac-type epoxy resins such as novolac epoxy resin and cresol novolac epoxy resin; epoxy resins such as biphenyl-type epoxy resin, stilbene-type epoxy resin, triphenol methane-type epoxy resin, alkyl-modified triphenol methane-type epoxy resin, triazine kernel-containing epoxy resin, and dicyclopentadiene-modified phenol-type epoxy resin; triazine-ring-containing resins such as urea resin and melamine resin; unsaturated polyester resin; bismaleimide resin; polyurethane resin; diallyl phthalate resin; silicone resin; benzooxazine-ring-containing resin; and cyanate ester resin, wherein they may be used independently or in a mixed manner.

Among these, epoxy resins are particularly preferable. In this way, the heat resistance and adhesiveness may further be improved.

It is further preferable to use, as the above-described epoxy resins, an epoxy resin which exists in a solid form at room temperature (in particular, bisphenol-type epoxy resin), in combination with an epoxy resin which exists in a liquid form at room temperature (in particular, silicone-modified epoxy resin which exists in a liquid form at room temperature). In this way, the flexibility and resolution performance may be improved while keeping the heat resistance.

Content of the thermosetting resin is preferably 10 to 40 wt % of the whole resin composition, and more preferably 15 to 35 wt %, although not specifically limited. The content smaller than the lower limit value may degrade an effect of improving the heat resistance, whereas the content exceeding the upper limit value may degrade an effect of improving toughness of the adhesive film.

For the case where the thermosetting resin which exists in a liquid form at room temperature is used in combination, the total amount of the liquid photo-curable resin and the liquid thermosetting resin is preferably 60% weight or below of the total weight of resin composition, and more preferably 50 wt % or below. The lower limit is preferably set to 5 wt % or above, although not specifically limited. The content fallen in this range may ensure, in particular, heat resistance, flexibility and resolution performance well balanced thereamong.

The curable resin further preferably contains a curable resin curable both by light and heat. In this way, compatibility between the photo-curable resin and the thermosetting resin may be improved, thereby strength of the adhesive film after being cured (photo-cured and heat-cured) may be improved, and reliability of the final product may consequently be improved.

The curable resin curable both by light and heat may be exemplified by thermosetting resins having photo-functional groups such as acryloyl group, methacryloyl group and vinyl group; and photo-curable resins having heat-reactive groups such as epoxy group, phenolic hydroxyl group, alcoholic hydroxyl group, carboxyl group, acid anhydride group, amino group, and cyanate group. More specifically, (meth)acryl-modified phenol resin, and acryl copolymer resin having carboxyl groups and acryl groups in the side chains thereof, may be exemplified. Among these, (meth)acryl-modified phenol resin is preferable. The selection allows use of alkaline aqueous solution, less causative of environmental impact, as a developing solution in place of organic solvent, while keeping the heat resistance. The curable resin adoptable herein may be those described for the thermosetting resin and photo-curable resin.

As for the thermosetting resin having the photo-reactive group, ratio of modification (ratio of substitution) of the photo-reactive group is preferably 20 to 80% of the total reactive group of curable resin curable both by light and heat (total content of photo-reactive group and heat-reactive group), and more preferably 30 to 70%, although not specifically limited. The ratio of modification in the above-described range may ensure especially excellent resolution performance.

As for the photo-curable resin having the heat-reactive group, ratio of modification (ratio of substitution) of the heat-reactive group is preferably 20 to 80% of the total reactive group of curable resin curable both by light and heat (total content of photo-reactive group and heat-reactive group), and more preferably 30 to 70%, although not specifically limited. The ratio of modification in the above-described range may ensure especially excellent resolution performance.

Content of the curable resin curable both by light and heat is preferably 15 to 50 wt % of the whole the resin composition, and more preferably 20 to 40 wt %, although not specifically limited. The content smaller than the lower limit value may degrade an effect of improving the compatibility, whereas the content exceeding the upper limit value may degrade the developability and resolution performance.

The resin composition contains a filler. The filler is an important component for controlling water vapor transmission rate of the adhesive film. The filler may be exemplified by fibrous fillers such as alumina fiber and glass fiber; needle-like fillers such as potassium titanate, wollastonite, aluminum borate, needle-like magnesium hydroxide, and whisker; plate-like fillers such as talc, mica, sericite, glass flake, scaly graphite, and plate-like calcium carbonate; spherical (granular) filler such as calcium carbonate, silica, fused silica, sintered clay, and unsintered clay; and porous fillers such as zeolite and silica gel. A single species of them may be used, or two or more species may be used in a mixed manner. Among these, porous fillers are preferable. In this way, the adhesive film may be increased in the water vapor transmission rate.

Average particle size of the filler is preferably 0.01 to 90 μm, and more preferably 0.1 to 40 μm, although not specifically limited. The average particle size exceeding the upper limit value may induce abnormality in appearance of film and resolution failure, whereas the mean particle size smaller than the lower limit value may result in bonding failure in the process of bonding under heating. The mean particle size may be evaluated, typically by using a laser diffraction particle size analyzer SALD-7000 (from Shimadzu Corporation).

Content of the filler is preferably 5 to 70 wt % of the whole resin composition, and more preferably 20 to 50 wt %, although not specifically limited. The content exceeding the upper limit value may induce bonding failure in the process of bonding under heating, whereas the content smaller than the lower limit value may fail in improving dewing of the substrate, because of insufficient water vapor transmission rate.

As the filler, a porous filler is preferably used. When a porous filler is used as the filler, the porous filler preferably has a mean void diameter of 0.1 to 5 nm, and more preferably 0.3 to 1 nm. If the mean void diameter exceeds the upper limit value, a part of resin component may enter the voids so as to inhibit the reaction, whereas if the mean void diameter is smaller than the lower limit value, the film may degrade the water vapor transmission rate due to lowered moisture absorption performance, and may fail in improving the dewing of the substrate. Molecular Sieve composed of a crystalline zeolite may specifically be exemplified as the porous filler. The crystalline zeolite is expressed by the formula below:

$$M_{2/n}O \cdot Al_2O_3 \cdot xSiO_2 \cdot yH_2O$$

M: metal cation, n: valency.

Crystal types of the crystalline zeolite may be exemplified by 3A, 4A, 5A and 13X, wherein 3A-type and 4A-type are preferably used from the viewpoint of effectively preventing the dewing.

Adsorptivity [Q1] at room temperature of the filler is not specifically limited, but is preferably 7 [g/100 g filler] or above, and more preferably 15 [g/100 g filler] or above. The adsorptive force at room temperature smaller than the lower limit value may fail in improving the dewing of the substrate, because of insufficient water absorption performance of the filler, and of decrease in water vapor transmission rate of the film. The adsorptivity [Q1] at room temperature may be determined based on increase in weight observed after weighing the filler completely dried by heating in an aluminum cup, and allowing it to stand in a 25° C./50% environment for 168 hours.

Adsorptivity [Q2] at 60° C. of the filler is preferably 3 [g/100 g filler] or above, and more preferably 10 [g/100 g filler] or above, although not specifically limited. The adsorptivity kept at the above-described value even under 60° C. may be effective particularly for improving dewing of the substrate. The adsorptivity [Q2] at 60° C. may be determined based on increase in weight observed after weighing the filler completely dried by heating in an aluminum cup, and allowing it to stand in a 60° C./90% environment for 168 hours.

The adsorptivity [Q1] at room temperature and the adsorptivity [Q2] at 60° C. preferably satisfy the relation below, although not specifically limited: $0.4*[Q1]<[Q2]$ When [Q1] and [Q2] satisfy the relation in the above, a particularly large effect of improving dewing of the substrate may be obtained. This is supposedly because the filler retains the adsorptivity even under high temperatures, thereby the film filled therewith retains water vapor transmission rate at relatively high temperatures, allowing gaseous moisture to readily pass therethrough, so that moisture in semiconductor devices or liquid crystal devices can instantaneously be reduced even if the temperature is lowered from high temperatures to room temperature, so as to avoid phenomenon of dewing.

The resin composition may contain, in addition to the above-described curable resin and filler, additives such as plastic resin, leveling agent, defoaming agent and coupling agent, so far as the objects of the present invention will not be impaired.

The semiconductor component bonded using the above-described adhesive film may be exemplified by solid-state image sensors such as CCD and CMOS, and semiconductor elements such as MEMS element, although not specifically limited. The liquid crystal display component may be exemplified by liquid crystal panel, although not specifically limited.

The substrate may be exemplified by flexible substrates and rigid substrates such as those called as interposer or mother board; insulated substrates composed of organic or inorganic material; and transparent substrates composed of acryl resin, polyethylene terephthalate resin (PET) and glass substrate. When the substrates, among these, composed of inorganic material are used, performance of the adhesive film may fully be expressed. This is supposedly because, if the substrates composed of organic material should otherwise be used, the adhesive film may exert only a small influence because the substrate is larger in the water vapor transmission rate as compared with the substrate composed of inorganic material. In contrast, if the substrate composed of inorganic material is used, only the portion of the adhesive film may be given as being water-transmissive, and may exert larger influence. Water vapor transmission rate of the substrate is preferably less than 30 [g/m$^2$·24 h].

EXAMPLES

The present invention will be explained in detail below, referring to Examples and Comparative Examples, without being limited thereto. First, Examples of the adhesive film will be explained. As for Molecular Sieve used in Examples, expression of "Molecular Sieve 3A" indicates that the crystal type thereof belongs to 3A type.

Example 1

1. Curable Resin Curable Both by Light and Heat (Synthesis of Acryl-Modified Phenol Resin)

Six hundred grams (OH equivalence of approximately 4) of a 70% MEK solution of non-volatile fraction of phenol novolac (Phenolite TD-2090-60M, from DIC Corporation) was placed in a 2-L flask, 1 g of tributylamine, and 0.2 g of hydroquinone were added thereto, and the mixture was heated to 110° C. Further therein, 284 g (2 mol) glycidyl methacrylate was added dropwise over 30 minutes, the mixture was allowed to react at 110° C. for 5 hours under stirring, to thereby obtain methacryloyl-group-containing phenol novolac (rate of modification with methacryloyl group: 50%) having a non-volatile content of 80%.

2. Preparation of Resin Varnish

A resin varnish was prepared by weighing 5.1 wt % of acryl resin compound (triethylene glycol dimethacrylate; Neomer PM201 from Sanyo Chemical Industries, Ltd.) which exists in a liquid form at room temperature as the photo-curable resin, 12.9 wt % of epoxy resin (Epiclon N-865 from DIC Corporation) and 5.4 wt % of silicone epoxy resin (BY16-115 from Dow Corning Toray Co., Ltd.) as the thermosetting resins, 28.2 wt % of (meth)acryl-modified phenol resin synthesized in the above as the curable resin curable both by light and heat, 1.9 wt % of photo-polymerization initiator (Irgacure 651 from Ciba Specialty Chemicals Inc.), 31.8 wt % of porous filler (Molecular Sieve 3A from Union Showa K.K.) as the filler, and 14.7 wt % of methyl ethyl ketone as the solvent, and the mixture was stirred using a disperser at a number of rotation of 5,000 rpm for 1 hour.

3. Manufacture of Adhesive Film

The above-described resin varnish was coated by using a comma coater onto a polyester film (T100G from Mitsubishi Polyester Film Corporation, 25 μm thick) as a support base, and dried at 80° C. for 10 minutes to thereby obtain an adhesive film of 50 μm thick.

Example 2

All procedures were similar to those described in Example 1, except that the resin varnish was mixed as described below. Mixed were 4.4 wt % of acryl resin compound (Neomer PM201 from Sanyo Chemical Industries, Ltd.) which exist in a liquid form at room temperature as the photo-curable resin, 11.1 wt % of epoxy resin (Epiclon N-865 from DIC Corporation) and 4.7 wt % of silicone epoxy resin (BY16-115 from Dow Corning Toray Co., Ltd.) as the thermosetting resins, 24.3 wt % of (meth)acryl-modified phenol resin synthesized in the above as the curable resin curable both by light and heat, 1.6 wt % of photo-polymerization initiator (Irgacure 651 from Ciba Specialty Chemicals Inc.), 41.2 wt % of porous filler (Molecular Sieve 3A from Union Showa K.K.) as the filler, and 12.7 wt % of methyl ethyl ketone as the solvent.

Example 3

All procedures were similar to those described in Example 1, except that the resin varnish was mixed as described below. Mixed were 5.5 wt % of acryl resin compound (Neomer PM201 from Sanyo Chemical Industries, Ltd.) which exists in a liquid form at room temperature as the photo-curable resin, 14.1 wt % of epoxy resin (Epiclon N-865 from DIC Corporation) and 5.9 wt % of silicone epoxy resin (BY16-115 from Dow Corning Toray Co., Ltd.) as the thermosetting resins, 30.7 wt % of (meth)acryl-modified phenol resin synthesized in the above as the curable resin curable both by light and heat, 2.1 wt % of photo-polymerization initiator (Irgacure 651 from Ciba Specialty Chemicals Inc.), 25.7 wt % of porous filler (Molecular Sieve 3A from Union Showa K.K., void diameter 3 Å) as the filler, and 16.0 wt % of methyl ethyl ketone as the solvent.

Example 4

All procedures were similar to those described in Example 1, except that a filler described below was used. A porous filler (Molecular Sieve 4A from Union Showa K.K., void size=4 Å) was used as the filler.

Example 5

All procedures were similar to those described in Example 1, except that a filler described below was used. A porous filler (Molecular Sieve 13X from Union Showa K.K., void size= 5 Å) was used as the filler.

Example 6

All procedures were similar to those described in Example 1, except that a filler described below was used. A porous filler (Molecular Sieve 13X from Union Showa K.K., void size= 10 Å) was used as the filler.

Example 7

All procedures were similar to those described in Example 1, except that a resin curable both by light and heat described below was used. An acryl copolymer resin (Cyclomer P from Daicel Chemical Industries, Ltd.), having carboxyl groups and acryl groups thereof, was used as the resin curable both by light and heat.

Example 8

All procedures were similar to those described in Example 1, except that the resin varnish was mixed as described below. Mixed were 5.1 wt % of acryl resin compound (Neomer PM201 from Sanyo Chemical Industries, Ltd.) which exists in a liquid form at room temperature as the photo-curable resin, 12.9 wt % of epoxy resin (Epiclon N-865 from DIC Corporation) and 5.4 wt % of silicone epoxy resin (BY16-115 from Dow Corning Toray Co., Ltd.) as the thermosetting resins, 28.2 wt % of (meth)acryl-modified phenol resin synthesized in the above as the curable resin curable both by light and heat, 1.9 wt % of photo-polymerization initiator (Irgacure 651 from Ciba Specialty Chemicals Inc.), 15.9 wt % of porous filler (from Union Showa K.K., Molecular Sieve 3A) as the filler, 15.9 wt % of silica (Admafine SE5101 from Admatechs Co., Ltd.), and 14.7 wt % of methyl ethyl ketone as the solvent.

Example 9

All procedures were similar to those described in Example 1, except that the resin varnish was mixed as described below. Mixed were 5.1 wt % of acryl resin compound (Neomer PM201 from Sanyo Chemical Industries, Ltd.) which exists in a liquid form at room temperature as the photo-curable resin, 12.9 wt % of epoxy resin (Epiclon N-865 from DIC Corporation) and 5.4 wt % of silicone epoxy resin (BY16-115 from Dow Corning Toray Co., Ltd.) as the thermosetting resins, 28.2 wt % of (meth)acryl-modified phenol resin synthesized in the above as the curable resin curable both by light and heat, 1.9 wt % of photo-polymerization initiator (Irgacure 651 from Ciba Specialty Chemicals Inc.), 15.9 wt % of porous filler (Molecular Sieve 3A from Union Showa K.K.) as the filler, 15.9 wt % of silica gel (Mizusawa Industrial Chemicals, Ltd.), and 14.7 wt % of methyl ethyl ketone as the solvent.

Comparative Example 1

All procedures were similar to those described in Example 1, except that the resin varnish was mixed as described below. Mixed were 5.1 wt % of acryl resin compound (Neomer PM201 from Sanyo Chemical Industries, Ltd.) which exists in a liquid form at room temperature as the photo-curable resin, 12.9 wt % of epoxy resin (Epiclon N-865 from DIC Corporation) and 5.4 wt % of silicone epoxy resin (BY16-115 from Dow Corning Toray Co., Ltd.) as the thermosetting resins, 28.2 wt % of (meth)acryl-modified phenol resin synthesized in the above as the curable resin curable both by light and heat, 1.9 wt % of photo-polymerization initiator (Irgacure 651 from Ciba Specialty Chemicals Inc.), 31.8 wt % of silica (Admafine SE5101 from Admatechs Co., Ltd.) as the filler, and 14.7 wt % of methyl ethyl ketone as the solvent.

Comparative Example 2

All procedures were similar to those described in Example 1, except that the resin varnish was mixed as described below. Mixed were 8.1 wt % of acryl resin compound (Neomer PM201 from Sanyo Chemical Industries, Ltd.) which exists in a liquid form at room temperature as the photo-curable resin, 20.5 wt % of epoxy resin (Epiclon N-865 from DIC Corporation) and 8.6 wt % silicone epoxy resin (BY16-115 from Dow Corning Toray Co., Ltd.) as the thermosetting resins, 44.8 wt % of (meth)acryl-modified phenol resin synthesized in the above as the curable resin curable both by light and heat, 3.0 wt % of photo-polymerization initiator (Irgacure 651 from Ciba Specialty Chemicals Inc.), and 15.0 wt % of methyl ethyl ketone as the solvent.

The adhesive films obtained by the individual Examples and Comparative Examples were evaluated as follows. Items to be evaluated are shown together with the details. Obtained results are shown in Table 1.

1) Film Characteristics (Tensile Fracture Strength)

The obtained adhesive films were exposed to light of 365 nm so as to irradiate light to as much as 750 mJ/cm$^2$, and allowed to cure at 120° C. for 1 hour, and to further cure at 180° C. for 2 hours, to thereby obtain a cured film. Dumbbell specimens were manufactured from the cured film conforming to JIS K7127, and subjected to tensile test. Tensile fracture strength of the individual adhesive films was measured.

2) Developability

The obtained adhesive films were immersed in 3% TMAH (tetramethylammonium hydroxide) at 25° C., and developability was judged as "yes" if the resin dissolved within 3 minutes rather than remaining on the polyester film as a support base, and judged as "no" if the resin remained.

3) Resolution Performance (Numerical Aperture)

Resolution performance was evaluated based on numerical aperture as described below. Each of the obtained adhesive films was laminated to a polyimide film at 55° C., and subjected to pattern-forming exposure using a negative film mask for forming a 200-μm-diameter via, allowing therethrough light of 365 nm to be irradiated to as much as 200 mJ/cm$^2$. Thereafter, the film was developed using 3% TMAH at a pressure of spraying of 0.1 MPa for 90 seconds, diameter of the patterned via was measured under a measuring microscope, and the numerical aperture was calculated using the equation below.

Numerical aperture (%)=Diameter of opening actually measured (μm)/diameter of mask 200(μm)×100

4) Water Vapor Transmission Rate

Using a laminator set to 60° C., the obtained adhesive films were bonded to manufacture a film of 100 μm thick, exposed by light using an exposure apparatus at an energy of exposure of 750 mJ/cm$^2$ (wavelength: 365 nm), and allowed to cure at 120° C. for 1 hour, and then at 180° C. for 1 hour. The obtained cured films were evaluated conforming to the moisture permeable cup method (JIS Z0208), under environments of 40° C./90% and 25° C./50%, to calculate water vapor transmission rate.

TABLE 1

|  | Example 1 | Example 2 | Example 3 | Example 4 | Example 5 | Example 6 |
|---|---|---|---|---|---|---|
| Tensile fracture strength (MPa) | 74 | 83 | 70 | 77 | 75 | 79 |
| developability | Yes | Yes | Yes | Yes | Yes | Yes |
| Aperture ratio (%) | 89 | 82 | 92 | 89 | 88 | 86 |
| Water vapor transmission rate 25° C./50% (g/m$^2$ · 24 h) | 8.5 | 13.2 | 7.9 | 8.3 | 8.1 | 8.7 |
| Water vapor transmission rate 40° C./90% (g/m$^2$ · 24 h) | 81.2 | 122.9 | 69.3 | 79.0 | 77.1 | 80.5 |

|  | Example 7 | Example 8 | Example 9 | Comparative Example 1 | Comparative Example 2 |
|---|---|---|---|---|---|
| Tensile fracture strength (MPa) | 68 | 77 | 73 | 78 | 64 |
| developability | Yes | Yes | Yes | Yes | Yes |
| Aperture ratio (%) | 94 | 87 | 88 | 88 | 94 |
| Water vapor transmission rate 25° C./50% (g/m$^2$ · 24 h) | 8.4 | 4.5 | 5.1 | 2.1 | 2.4 |
| Water vapor transmission rate 40° C./90% (g/m$^2$ · 24 h) | 78.3 | 33.9 | 37.1 | 16.2 | 24.8 |

As is clear from Table 1, Example 1 to 9 were large in the tensile strength of the adhesive films, excellent in the film characteristics, and excellent also in the developability and resolution performance.

Next, Examples of bonded products obtained by bonding the semiconductor component and the substrate using the above-described adhesive film will be explained.

Example 1A to 9A and Comparative Example 1A to 2A

A 6-inch wafer having solid-state image sensors mounted thereon as the semiconductor component was obtained, and each of the above-described adhesive film was laminated on the 6-inch wafer using a laminator set to 60° C. The film was then subjected to exposure through a negative mask using an exposure apparatus, followed by development, to thereby manufacture a patterned sample. Shape and arrangement of the obtained pattern were such as surrounding a light sensing portion of each solid-state image sensor, like a frame as wide as 100 μm. The exposure was given so as to irradiate light of 365 nm to as much as 750 mJ/cm$^2$, and the development was carried out using 3% TMAH (tetraammonium hydroxide), at a pressure of spraying of 0.1 MPa for 90 seconds. Thus-obtained patterned sample were diced, and bonded to a glass substrate (5 mm×4 mm×0.5 mm) by thermocompression bonding (temperature=110° C., time=10 seconds, pressure=1 MPa). The obtained sample was allowed to cure at 120° C. for 1 hour, and further at 180° C. for 2 hours, placed on a substrate for evaluation, and bonded, to thereby manufacture a sample to be evaluated. The sample to be evaluated was subjected to an accelerated reliability test generally adopted to semiconductor devices. After being treated at 60° C., 90% humidity for 500 hours, the sample was transferred to an environment of 25° C., 50% humidity, and whether dewing occurred or not inside the glass substrate of the sample to be evaluated was observed under a microscope. Results are shown in Table 2.

TABLE 2

|  | Example 1A | Example 2A | Example 3A | Example 4A | Example 5A | Example 6A |
|---|---|---|---|---|---|---|
| Evaluation of dewing | No dewing | No dewing | No dewing | No dewing | No dewing | No dewing |

|  | Example 7A | Example 8A | Example 9A | Comparative Example 1A | comparative Example 2A |
|---|---|---|---|---|---|
| Evaluation of dewing | No dewing | No dewing | No dewing | Dewed | Dewed |

As is clear from Table 2, Examples 1A to 9A showed no dewing, no corrosion on electrodes, excellent electro-conductivity, good image, and a desirable level of reliability. In contrast, Comparative Examples 1A to 2A showed dewing, proving inferiority in the reliability of semiconductor devices. As judged from the results described in the above, the present invention provides an adhesive film excellent in performance, and excellent particularly in reliability as a material for composing semiconductor and liquid crystal devices.

The invention claimed is:

1. An adhesive film used for bonding a semiconductor component or a liquid crystal display component with a substrate so as to obtain a space formed therein,
   wherein said adhesive film is composed of a resin composition containing a photo-curable resin, a thermosetting resin, and a filler, and said adhesive film shows a water vapor transmission rate, measured conforming to JIS Z0208 Method-B, of 30 [g/m$^2$·24 h] or above,
   wherein said photo-curable resin contains an ultraviolet curable resin having an acrylic type compound as a major constituent.

2. The adhesive film as claimed in claim 1, wherein said thermosetting resin contains an epoxy resin.

3. The adhesive film as claimed in claim 1, wherein said filler contains a porous filler.

4. The adhesive film as claimed in claim 3, wherein said filler has an average void diameter of 0.1 to 5 nm.

5. The adhesive film as claimed in claim 3, wherein said filler shows an adsorptivity [Q1] under room temperature (increase in weight of the filler completely dried under heating and weighed in an aluminum cup, after being allowed to stay in a 25° C./50% environment for 168 hours) of 7 [g/100 g filler] or above.

6. The adhesive film as claimed in claim 5, wherein said filler shows an adsorptivity [Q2] at 60° C. (increase in weight of the filler completely dried under heating and weighed in an aluminum cup, after being allowed to stand in a 60° C./90% environment for 168 hours) of 3 [g/100g filler] or above.

7. The adhesive film as claimed in claim 6, satisfying 0.4×[Q1]<[Q2].

8. The adhesive film as claimed in claim 3, wherein said filler is zeolite.

9. The adhesive film as claimed in claim 1, wherein said adhesive film shows a water vapor transmission rate, measured conforming to JIS Z0208 Method-B, of 200 [g/m$^2$·24 h] or below.

10. The adhesive film as claimed in claim 1, wherein said adhesive film shows a water vapor transmission rate at 25° C. (measured conforming to JIS Z0208, under conditions of moisture permeation treatment of 25° C./50%) of 4 [g/m$^2$·24 h] or above.

11. The adhesive film as claimed in claim 1, wherein said substrate shows a water vapor transmission rate, measured conforming to JIS Z0208 Method-B, of less than 30 [g/m$^2$·24 h].

* * * * *